US011043632B2

(12) United States Patent
Sundar et al.

(10) Patent No.: US 11,043,632 B2
(45) Date of Patent: Jun. 22, 2021

(54) ION BEAM ETCHING PROCESS DESIGN TO MINIMIZE SIDEWALL RE-DEPOSITION

(71) Applicant: Headway Technologies, Inc., Milpitas, CA (US)

(72) Inventors: Vignesh Sundar, Fremont, CA (US); Guenole Jan, San Jose, CA (US); Dongna Shen, San Jose, CA (US); Yi Yang, Fremont, CA (US); Yu-Jen Wang, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 16/573,087

(22) Filed: Sep. 17, 2019

(65) Prior Publication Data
US 2021/0083180 A1    Mar. 18, 2021

(51) Int. Cl.
*H01L 43/12*    (2006.01)
*H01L 43/02*    (2006.01)
*H01L 27/22*    (2006.01)

(52) U.S. Cl.
CPC ............ *H01L 43/12* (2013.01); *H01L 27/222* (2013.01); *H01L 43/02* (2013.01)

(58) Field of Classification Search
CPC ......... H01L 43/12; H01L 43/08; H01L 43/02; H01L 27/222; H01L 27/228; G11C 11/161; G11C 11/15; H01J 2237/334
See application file for complete search history.

(56) References Cited

U.S. PATENT DOCUMENTS

| | | | |
|---|---|---|---|
| 2014/0070342 A1* | 3/2014 | Sandhu | H01L 43/02 257/421 |
| 2014/0170776 A1* | 6/2014 | Satoh | H01L 43/12 438/3 |
| 2016/0218280 A1* | 7/2016 | Park | H01L 43/12 |
| 2016/0336509 A1* | 11/2016 | Jeong | H01L 21/02071 |
| 2018/0069176 A1* | 3/2018 | Lee | H01L 27/222 |
| 2018/0123029 A1* | 5/2018 | Park | H01L 27/222 |
| 2018/0233662 A1* | 8/2018 | Berry, III | H01F 10/3254 |
| 2018/0240646 A1* | 8/2018 | Kodaira | H01J 37/32357 |
| 2019/0067000 A1* | 2/2019 | Shen | H01L 21/311 |

* cited by examiner

*Primary Examiner* — Jaehwan Oh
(74) *Attorney, Agent, or Firm* — Saile Ackerman LLC; Stephen B. Ackerman; Rosemary L. S. Pike

(57) ABSTRACT

A first pattern is formed on an MTJ stack as a first array of first parallel bands. A first ion beam etching is performed on the MTJ stack using the first pattern wherein a tilt between an ion beam source and the substrate is maintained such that a horizontal component of the ion beam is parallel to the first parallel bands and the substrate is not rotated. Thereafter, a second pattern is formed on the MTJ stack as a second array of parallel bands wherein the second parallel bands are perpendicular to the first parallel bands. A second ion beam etching is performed using the second pattern wherein a tilt between an ion beam source and the substrate is maintained such that a horizontal component of the ion beam is parallel to the second parallel bands and wherein the substrate is not rotated to complete formation of the MTJ structure.

8 Claims, 4 Drawing Sheets

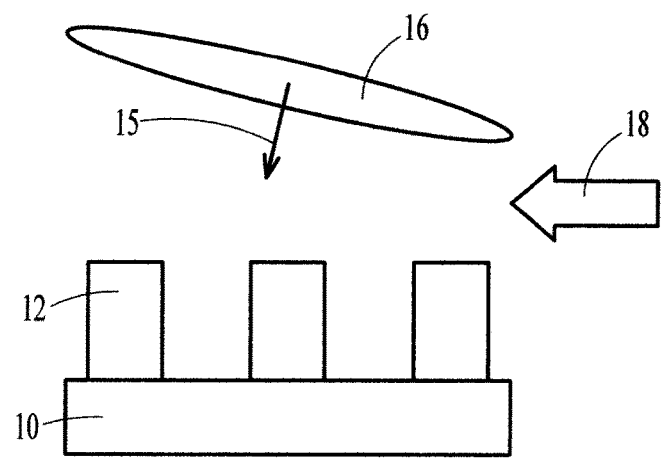
Figure 3
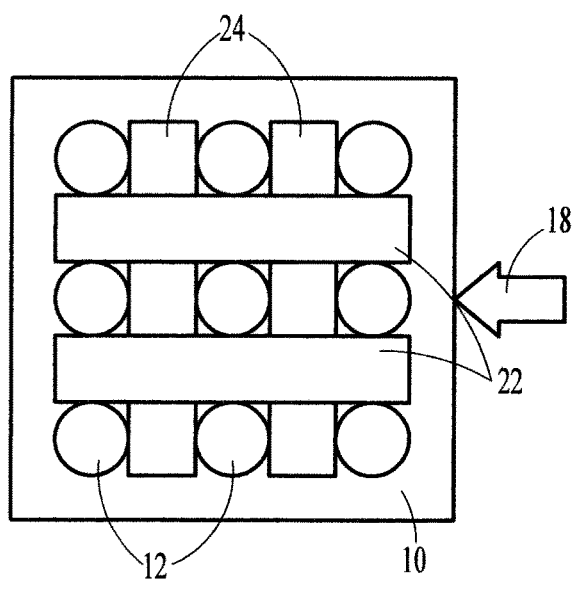 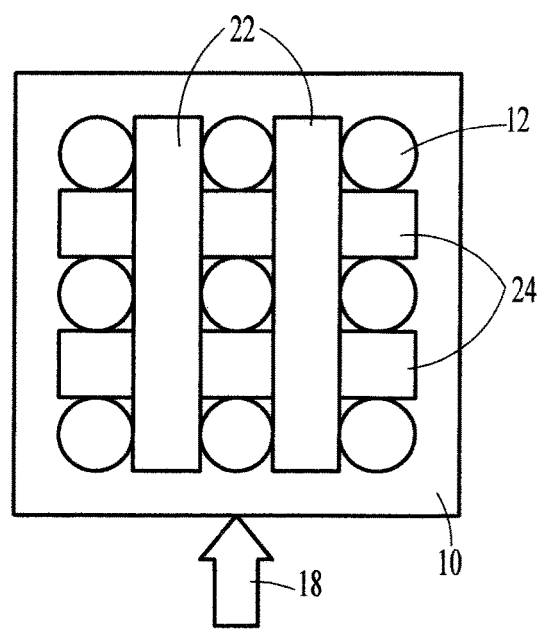
Figure 4A Prior Art    Figure 4B Prior Art

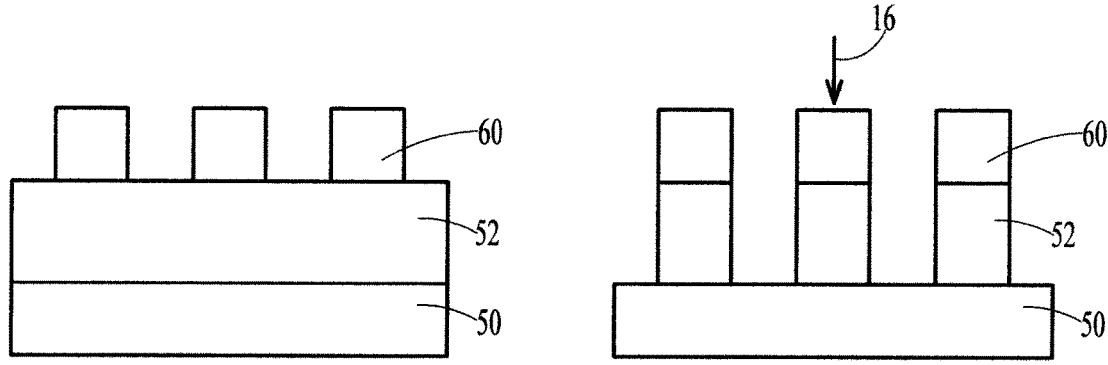
Figure 7                    Figure 8
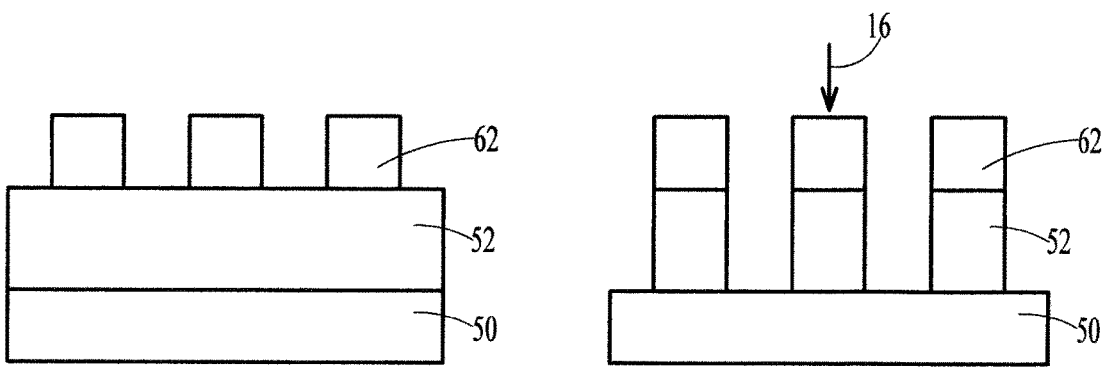
Figure 9                    Figure 10

ION BEAM ETCHING PROCESS DESIGN TO MINIMIZE SIDEWALL RE-DEPOSITION

TECHNICAL FIELD

This application relates to the general field of magnetic tunneling junctions (MTJ) and, more particularly, to methods for improving the process margin and enhancing device performance in the fabrication of MTJ structures.

BACKGROUND

The method used to pattern Magnetic Tunnel Junction (MTJ) devices for STT-MRAM and other applications has a significant impact on their performance, particularly as we start moving towards sub-100 nm devices. A typical process flow for MTJ device fabrication involves the following steps (FIG. 1): First, the MTJ films are deposited (step 100), then a hard mask is deposited (step 102). A pattern is defined using lithography (step 104). The pattern is transferred into the hard mask (step 106), then into the MTJ (step 108). Finally, the patterned MTJ is encapsulated (step 110).

Outside of these steps, others are added to create contacts to the tunnel junction and also to integrate them into the chip. In the present disclosure, we discuss the pros and cons for commonly used etch processes for MTJ etching, and propose a novel process flow which potentially will reduce the defect rates at the chip level.

Several patent applications show ion beam etching (IBE) to limit re-deposition, such as U.S. Patent Application 2018/0233662 (Berry et al) and 2018/0240646 (Kodaira et al).

SUMMARY

It is a primary object of the present disclosure to provide a method of enhancing device performance in the fabrication of MTJ structures.

Another object of the present disclosure is to provide a method of enhancing device performance by fabricating MTJ structures with lithe or no conductive sidewall re-deposition during etching and with minimal intermixing and other beam-induced damage to the sidewall.

A further object is to provide an ion beam etching process design to drastically reduce or eliminate conductive sidewall re-deposition on MTJ structures and with minimal intermixing and other beam-induced damage to the sidewall.

In accordance with the objectives of the present disclosure, a method for fabricating a magnetic tunneling junction (MTJ) structure is achieved. A MTJ stack is deposited on a substrate. A first pattern is formed on the MTJ stack as a first array of first parallel bands. A first ion beam etching is performed on the MTJ stack using the first pattern wherein a tilt between an ion beam source and the substrate is maintained such that a horizontal component of the ion beam is parallel to the first parallel bands and wherein the substrate is not rotated. Thereafter, a second pattern is formed on the MTJ stack as a second array of second parallel bands wherein the second parallel bands are perpendicular to the first parallel bands. A second ion beam etching is performed on the MTJ stack using the second pattern wherein a tilt between an ion beam source and the substrate is maintained such that a horizontal component of the ion beam is parallel to the second parallel bands and wherein the substrate is not rotated to complete formation of the MTJ structure.

BRIEF DESCRIPTION OF THE DRAWINGS

In the accompanying drawings forming a material part of this description, there is shown:

FIG. 3 illustrates in cross-sectional representation vertical and horizontal components of an ion beam etching process.

FIGS. 4A and 4B illustrate a top view of the results of an ion beam etching process of the prior art.

FIGS. 7-10 are cross-sectional representations of steps in the process of the present disclosure.

DETAILED DESCRIPTION

Reactive Ion Etching using methanol is one of the popular ways to etch MTJ thin films. In methanol-based RIE, a methanol gas plasma is generated within the etch chamber, and on reaction with transition metals such as Co, Fe, etc. which form a majority of the MTJ, volatile by-products are generated which are then pumped out of the etch chamber. In addition to the chemical etch component, a wafer bias is applied in order to accelerate the reactive ions towards the wafer with a certain voltage. This physical component induces a directionality to the etch process and thus MTJ pillars with the desired vertical sidewalls can be fabricated.

While the formation of volatile by-products helps to minimize the defect rates at the chip level, the chemically reactive component of the etch results in the formation of a 'damaged' sidewall. This damaged region results in the deterioration of MTJ performance, particularly when devices are scaled to sub 100 nm levels.

Ion Beam Etching presents an alternate etch solution that does not involve any chemical etch component. Typically a noble gas such as Ar is used, and a beam of Ar+ ions is generated in a separate source chamber. Xe, Ne, and Kr are some of the other possibilities. These ions are accelerated to ~50-1000 V, collimated using a system of grids, and directed at the wafer. A stream of electrons is directed at the ion beam en route to the wafer in order to neutralize the beam and prevent charge buildup at the wafer surface. When Ar atoms collide with the wafer surface, they result in the ejection of atoms from the wafer surface much like the sputtering process. The ejected atoms have a range of energies, sometimes sufficient to escape the wafer area and redeposit on the chamber sidewall or are pumped out from the chamber. On the other hand, if there are any features blocking the path of the ejected atom, the atom will simply stick to its surface. This is called re-deposition. Thus while an MTJ pillar is being etched using IBE, the material etched close to the MTJ device has a high chance of re-depositing on the MTJ sidewall. Since the MTJ film stack consists mostly of conductive metals (except the tunnel barrier itself and perhaps an additional $H_k$ enhancing oxide layer), the re-deposited material is typically conductive. This could potentially form a conductive path across the tunnel barrier and result in a shorted device. Minimizing re-deposition is one of the key challenges that have to be overcome for IBE to become the etch process of choice for MTJ fabrication.

Figure 1:
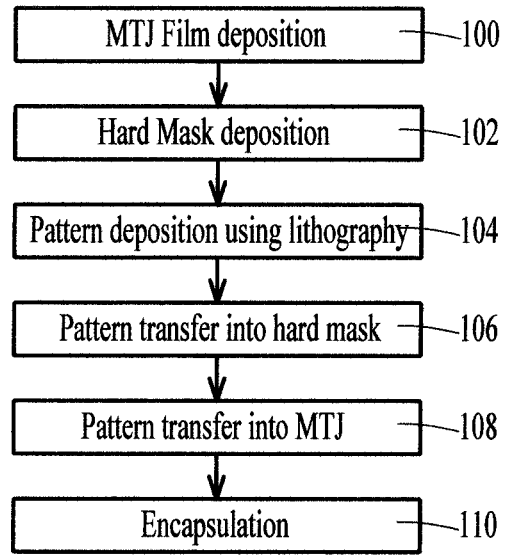
FIG. 1 is a flow chart of a typical MTJ device fabrication process flow.
Figures 2A, 2B:
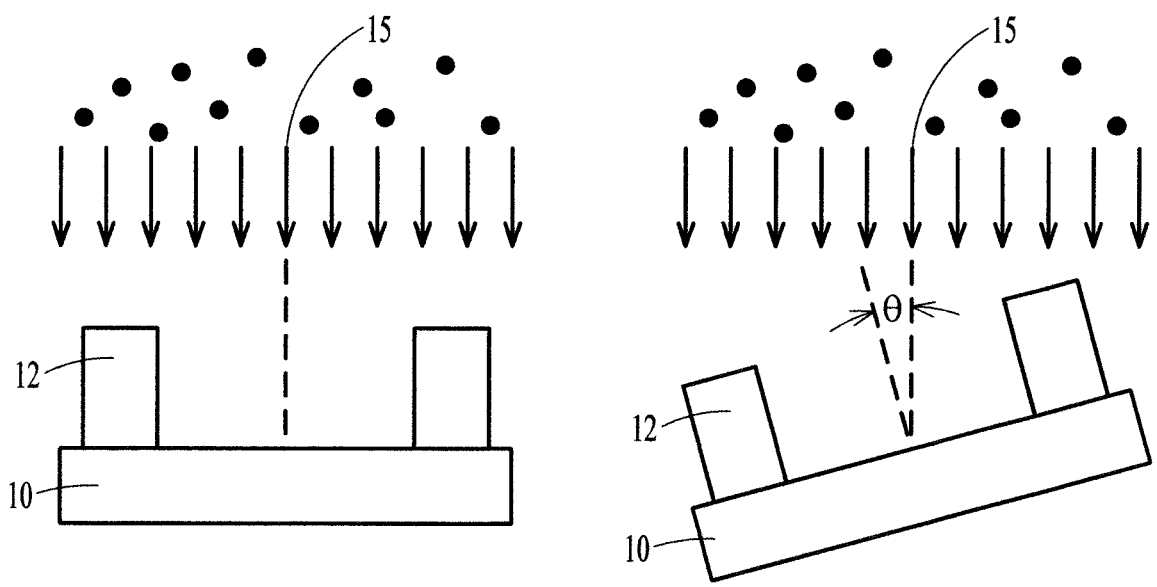
FIGS. 2A and 2B illustrate the cross-sectional view in a typical ion beam etching process.

Let us consider the scenario shown in FIGS. 2A and 2B below. The film already etched 12 and the film still to be etched 10 are shown. The angle between the direction of the ion beam 15 and the normal to the wafer surface is denoted by Θ. When Θ=0, as shown in FIG. 2A, in an idealized ion milling scenario with no faceting or trenching, the side of the MTJ pillar is not etched at all and a certain fraction of the material etched from the wafer surface deposits on the sidewall. As e is increased, say to 20 degrees, as shown in FIG. 2B, there is still re-deposition of material on the sidewall from the wafer surface, but now the sidewall is also etched by the ion beam 15 (at a 70 degree angle in this scheme). There is thus a steady state between the re-deposition of material and etch of the re-deposited material. When Θ is increased even further, the rate at which the sidewall gets etched becomes higher than the rate of re-deposition. Thus, in a typical IBE etch process, the wafer is tilted to a certain angle with respect to the ion beam in order to minimize re-deposition and rotated to ensure a uniform etch.

However, there is a 'damage' induced to the sidewall due to the high energy nature of the ion beam. This 'damage' includes damage to the crystal structure of the key layers of the magnetic tunnel junction and intermixing of various materials into the sidewall as well as incorporation of the atoms of the beam, Ar for example, into the sidewall. All of these mechanisms could potentially degrade device performance. It is therefore important to minimize the interaction of the ion beam with the device sidewall, particularly the component that is directed from the edge towards the center of the device or into the device.

Since the presence of conductive re-deposited material creates shorting paths across the tunnel barrier, minimizing the re-deposition is critical to ensuring good chip level performance. If the etch process used to define the MTJ pillar results in re-deposition across the barrier (a 0 degree etch as described above for example), the re-deposition has to be cleaned off, for example using a higher angle IBE etch. However, this might have detrimental side-effects as explained earlier. Another potential way to treat the re-deposition is by exposing the etched sidewall (with re-deposition) to an oxygen source in an attempt to oxidize (most metal oxides are insulating) the re-deposition layer. An undesirable consequence of this is the redistribution of this oxygen from the re-deposition layer to the various materials used in the MTJ which will then impact their performance. There is thus a need to design an etch process minimizing or completely eliminating the re-deposition of conductive materials, particularly across the tunnel barrier, free layer, cap, etc.

Since the final MTJ shape is typically a pillar/cylinder when integrated with CMOS, a typical integration scheme for its fabrication involves the use of lithography to define a cylinder shape into a resist, use the resist as a mask to etch a hard mask, and subsequently use the hard mask to etch and define the MTJ pillar. These pillars are typically arranged in a regular pattern on the surface of the wafer, such as a square, hexagonal or rectangular pattern. FIG. 3 illustrates an example during the IBE process at any one point of time.

The plane 16 represents the ion beam source, and the dashed black arrow 15 represents the direction of the ion beam. The plane of the ion source is tilted with respect to the wafer as we discussed above in FIG. 2B. Alternatively, the wafer is tilted with respect to the ion source. In this snapshot, we capture this tilt using the black solid arrow 18. If we split the Ar beam into its horizontal and vertical components, we see that the horizontal component will be in the direction of the black solid arrow 18.

The plane 16 represents the ion beam source, and the black arrow 15 represents the direction of the ion beam. The plane of the ion source is tilted with respect to the wafer as we discussed above in FIG. 2B. Alternatively, the wafer is tilted with respect to the ion source. In this snapshot, we capture this tilt using the wide arrow 18. If we split the Ar beam into its horizontal and vertical components, we see that the horizontal component will be in the direction of the wide arrow 18.

Taking a top-down view at the wafer now (FIG. 4), we can then define the zones which will result in re-deposition on the pillars and zones which will not contribute to re-deposition on one of the pillars. In FIGS. 4A and 4B, the horizontal component will be in the direction of the wide arrow 18. Referring now to FIG. 4A, the zones 24 result in re-deposition on the pillars 12 and zones 22 will not contribute to re-deposition. That is, re-deposition will occur on left and right sides of each pillar, but not on top and bottom of the pillars, as seen in top view. Now, if we rotate the source by 90 degrees and keep the wafer at the same position, we get the situation in FIG. 4B, where now the zones contributing to re-deposition 24 are also rotated 90 degrees. Thus, during the IBE process, we see that if the pattern consists of a pattern of pillars, there will always be zones contributing to re-deposition onto the pillars during any point of the wafer/source rotation.

When patterning and etching are done in this way, i.e., using an array of hard mask pillars to etch the array of MTJ pillars using IBE, we see that there is always a source of re-deposition for each tunnel junction. A higher angle etch, a high angle clean step, an oxidation step, or the like have to be used to treat the conductive re-deposition so that it does not short the MTJ device.

In the present disclosure, we describe an etch process design to pattern tunnel junctions without re-deposition. Instead of patterning an array of hard mask pillars and transferring that pattern to the MTJ layer, we split the process into two steps—in each of these steps, an array of hard mask lines is fabricated and etched into the tunnel junction layer(s). The second pattern of lines is fabricated perpendicular to the first pattern; the MTJ area is thus like the points of intersection of a grid, and so once the two-step etch is completed, a square array of MTJ pillars will be fabricated similar to the previous case.

Figure 5A:
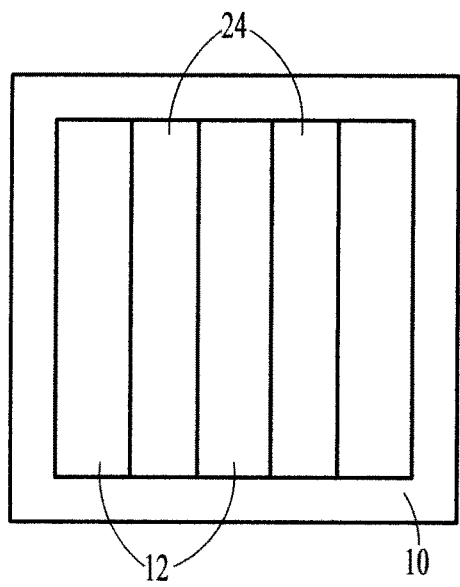
FIGS. 5A and 5B illustrate a top view of the results of the first step of an ion beam etching process of the present disclosure.
Figure 5B:
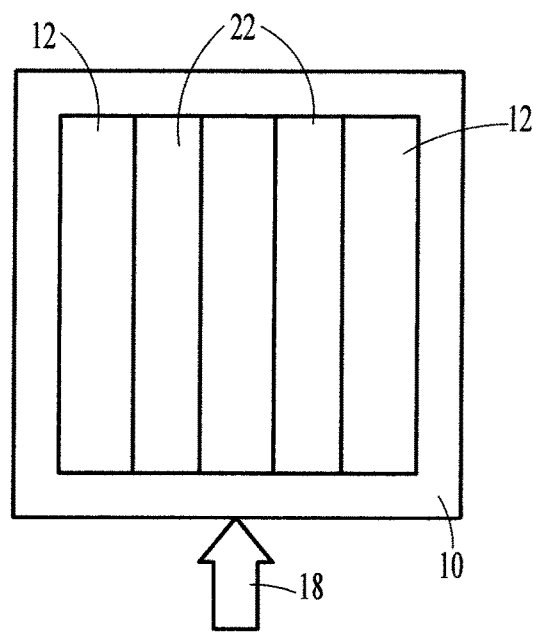

Let us look at the difference this brings about in the etch process. In FIGS. 5A and 5B, we see a snapshot of the IBE process once again, except this time, an array of hard mask lines 12 replaces the array of pillars. In FIGS. 5A and 5B, the horizontal component will be in the direction of the wide arrow 18. In the case shown in FIG. 5B, as before, with the orientation of the beam and the wafer, we see that there will be no re-deposition 22 on the patterned lines 12. In the case shown in FIG. 5A, with this particular orientation, there will be re-deposition 24 all along the lines 12. It is therefore an important step in the process that in the ion beam etching system, we fix the orientation of the wafer to the ion source, and do not rotate the wafer so that the etching scheme described in FIG. 5B can be realized. That is, the horizontal component 18 of the ion beam is parallel to the patterned features 12 in the active area.

For example, FIGS. 7-10 show the two steps of the etching process in cross-sectional representation. FIG. 7 shows MTJ stack 52 on a bottom electrode 50, for example. The MTJ stack includes at least a pinned layer, a tunnel barrier layer, and a free layer. A hard mask layer is formed on the MTJ stack and patterned, for example, by photolithography to form an array of parallel hard mask lines 60. FIGS. 7 and 8 represent a cross-section across the line A-A' of FIG. 6. Now, as described above, as illustrated in FIG. 8, a first IBE step 16 is performed where the orientation of the wafer is fixed to the ion source such that the horizontal component of the ion beam is parallel to the parallel lines 60. Because of the fixed orientation of the wafer, there is no re-deposition on the sidewalls of the MTJ structures 52.

After removing the first pattern 60, for the second part of the etch, we pattern an array of lines in the perpendicular direction. The etch is then redone so that the relative orientation of the beam and the wafer is once again similar to the case of FIG. 5B. FIGS. 9 and 10 represent a cross-section across the line B-B' of FIG. 6. As shown in FIG. 9, a second hard mask layer is formed on the MTJ stack and patterned, for example, by photolithography to form an array of parallel hard mask lines 62, perpendicular to the first hard mask lines 60. Now, as illustrated in FIG. 10, a second IBE step 16 is performed where the orientation of the wafer is fixed to the ion source such that the horizontal component of the ion beam is parallel to the parallel lines 62.

Figure 6:
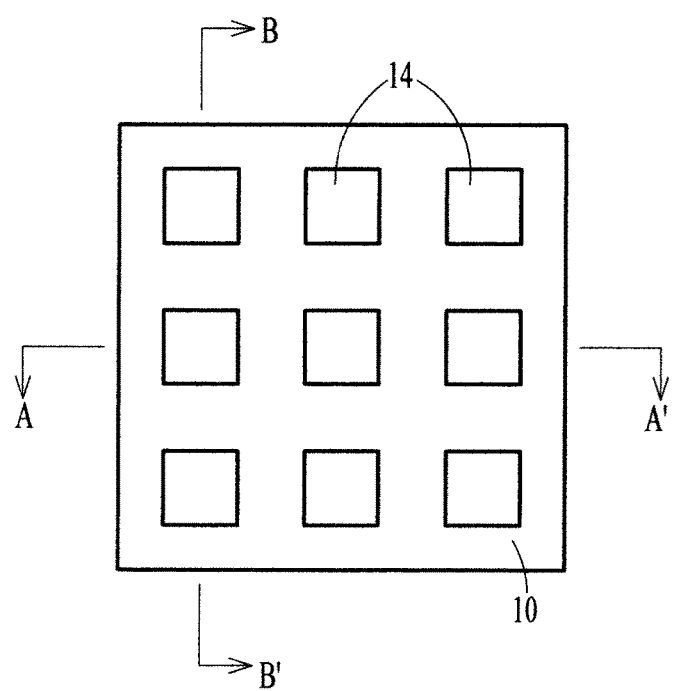
FIG. 6 illustrate a top view of the results of a second step of an ion beam etching process of the present disclosure.

Once again, because of the fixed orientation of the wafer to the ion beam source, there is no re-deposition on the MTJ 52 sidewalls. As illustrated in FIG. 6, once the two etching steps are done, the MTJ pillars 14 are now seen at the intersection points between these two patterns of lines. The rest of the integration process, such as encapsulation and the patterning of the contacts, is then completed.

Designing an etch process like this has the advantage of minimizing or completely eliminating re-deposition on the MTJ sidewall. This then reduces the amount of sidewall treatment that is needed to either oxidize or remove the re-deposition layer, which subsequently helps to achieve a chip with a low defect rate.

In summary, the process flow design for the patterning of MTJ devices according to the present disclosure includes the steps of:

1) Depositing of the film(s) comprising the Magnetic Tunnel Junction (MTJ), along with the various mask layers required for pattern transfer;

2) patterning an array of parallel bands or lines using lithography in the active area of interest on the wafer, utilizing IBE to transfer this pattern of lines down to the MTJ layers wherein the tilt between the ion beam source and the wafer is maintained in such a way that the horizontal component of the ion beam is parallel to the patterned features in the active area and wherein the wafer is not rotated; and 3) in a second lithography process, patterning a second array of parallel lines or bands wherein the orientation of these lines is perpendicular to the previously patterned lines, and a second IBE etch process with the same conditions as above, where the wafer and source are once again aligned in such a way that the horizontal component of the ion beam is parallel to the patterned features in the active area and wherein the wafer is not rotated.

The process of the present disclosure provides a two-step patterning process in which conductive sidewall re-deposition during ion beam etching is eliminated or greatly reduced, resulting in improved reliability and device performance.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method for fabricating an array of magnetic tunneling junction (MTJ) structures comprising:
   depositing a MTJ stack on a substrate;
   forming a first pattern on said MTJ stack as a first array of first parallel bands;
   first ion beam etching said MTJ stack using said first pattern wherein a tilt between an ion beam source and said substrate is maintained such that a horizontal component of said ion beam is parallel to said first parallel bands and wherein said substrate is not rotated;
   thereafter forming a second pattern on said MTJ stack as a second array of second parallel bands wherein said second parallel bands are perpendicular to said first parallel bands; and
   thereafter second ion beam etching said MTJ stack using said second pattern wherein a tilt between an ion beam source and said substrate is maintained such that a horizontal component of said ion beam is parallel to said second parallel bands and wherein said substrate is not rotated to complete formation of said MTJ structures.

2. The method according to claim 1 wherein said first and second ion beam etching use ions of one or more of: Ar, Xe, Ne, and Kr.

3. The method according to claim 1 after said second ion beam etching step, further comprising:
   encapsulating said MTJ structures.

4. The method according to claim 3 after said encapsulating said MTJ structures, further comprising:
   forming electrical contacts to said MTJ structures.

5. A method for fabricating an array of magnetic tunneling junction (MTJ) structures comprising:
   depositing a MTJ stack on a substrate;
   forming a first hard mask pattern on said MTJ stack as a first array of first parallel bands;
   first ion beam etching said MTJ stack using said first hard mask pattern wherein a tilt between an ion beam source and said substrate is maintained such that a horizontal component of said ion beam is parallel to said first parallel bands and wherein said substrate is not rotated;
   thereafter forming a second hard mask pattern on said MTJ stack as a second array of second parallel bands wherein said second parallel bands are perpendicular to said first parallel bands; and
   thereafter second ion beam etching said MTJ stack using said second hard mask pattern wherein a tilt between an ion beam source and said substrate is maintained such that a horizontal component of said ion beam is parallel to said second parallel bands and wherein said substrate is not rotated to complete formation of said MTJ structures with little or no conductive re-deposition on sidewalls of said MTJ structures.

6. The method according to claim 5 wherein said first and second ion beam etching use ions of one or more of: Ar, Xe, Ne, and Kr.

7. The method according to claim 5 after said second ion beam etching step, further comprising:
   encapsulating said MTJ structures.

8. The method according to claim 7 after said encapsulating said MTJ structures, further comprising:
   forming electrical contacts to said MTJ structures.

* * * * *